United States Patent
Ming et al.

(10) Patent No.: US 12,000,882 B2
(45) Date of Patent: Jun. 4, 2024

(54) SAMPLING MEASUREMENT METHOD, SYSTEM, COMPUTER DEVICE AND STORAGE MEDIUM

(71) Applicant: CHANGXIN MEMORY TECHNOLOGIES, INC., Hefei (CN)

(72) Inventors: Xianfeng Ming, Hefei (CN); Jinguang Li, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 365 days.

(21) Appl. No.: 17/506,767

(22) Filed: Oct. 21, 2021

(65) Prior Publication Data

US 2022/0291275 A1 Sep. 15, 2022

Related U.S. Application Data

(63) Continuation of application No. PCT/CN2021/109427, filed on Jul. 30, 2021.

(30) Foreign Application Priority Data

Mar. 10, 2021 (CN) .......................... 202110260844.X

(51) Int. Cl.
*G01R 31/26* (2020.01)

(52) U.S. Cl.
CPC .................. *G01R 31/2601* (2013.01)

(58) Field of Classification Search
CPC .................. G01R 31/2601; G01R 31/2894
See application file for complete search history.

(56) References Cited

U.S. PATENT DOCUMENTS

| 7,076,321 | B2 | 7/2006 | Purdy |
| 2006/0074503 | A1 | 4/2006 | Purdy |
| 2006/0161284 | A1* | 7/2006 | Ikeno ............... G05B 19/41865 |
| | | | 700/99 |

(Continued)

FOREIGN PATENT DOCUMENTS

| CN | 101032013 A | 9/2007 |
| CN | 101452272 A | 6/2009 |
| CN | 102478842 A | 5/2012 |

(Continued)

OTHER PUBLICATIONS

Yang Ruifen, "Work-in-process measurement sampling method and device" (ip.com Translation of application CN 104425300), Mar. 18, 2015, ip.com machine translation (Year: 2015).*

(Continued)

*Primary Examiner* — Christopher W Carter
(74) *Attorney, Agent, or Firm* — Cooper Legal Group, LLC

(57) ABSTRACT

Provided are a sampling measurement method and system, computer device and storage medium. The sampling measurement method includes: acquiring a preset measurement ratio of each process element in a process station; acquiring an actual measurement ratio of a process element associated with a lot of products to be measured that arrive at the measurement station in the process station; and, when the actual measurement ratio of the associated process element is less than the corresponding preset measurement ratio, controlling a measurement machine at the measurement station to measure the lot of products to be measured.

15 Claims, 7 Drawing Sheets

(56) References Cited

U.S. PATENT DOCUMENTS

2006/0178767 A1* 8/2006 Lee ................. G05B 19/41875
    700/109
2010/0076584 A1* 3/2010 Huang ............. G05B 19/41875
    702/83

FOREIGN PATENT DOCUMENTS

| | | |
|---|---|---|
| CN | 104425300 A | 3/2015 |
| CN | 104217970 B | 12/2016 |
| CN | 105470156 B | 9/2018 |
| JP | 2003083734 A | 3/2003 |
| WO | 2020212068 A1 | 10/2020 |

OTHER PUBLICATIONS

Fan Antao, "Wafer group allocation method" (ip.com Translation of application CN 102280398), Dec. 14, 2011, ip.com machine translation (Year: 2011).*

* cited by examiner

SAMPLING MEASUREMENT METHOD, SYSTEM, COMPUTER DEVICE AND STORAGE MEDIUM

CROSS-REFERENCE TO RELATED APPLICATION(S)

This application is continuation of international application PCT/CN2021/109427, filed on Jul. 30, 2021, which claims priority to Chinese patent application No. 202110260844.X, filed with CNIPA on Mar. 10, 2021 and entitled "SAMPLING MEASUREMENT METHOD, SYSTEM, COMPUTER DEVICE AND STORAGE MEDIUM". The contents of international application PCT/CN2021/109427 and Chinese patent application No. 202110260844.X are hereby incorporated by reference in their entireties.

TECHNICAL FIELD

This disclosure relates to the technical field of semiconductor and, in particular, to a sampling measurement method and system, computer device and storage medium.

BACKGROUND

In the manufacturing process of a semiconductor wafer, in order to grasp the status of the wafer process in time, find out problems in time, and improve and stabilize the yield, it is necessary to use a measurement machine to measure the wafer.

The measurement process is time-consuming and expensive. In the semiconductor manufacturing process, with the continuous expansion of production capacity, the utilization rate of measurement machine has also increased. However, the number of measurement machines is limited, the labor cost of the wafer foundry is also precious, and the reasonable allocation of the capacity of the measurement machine and the formulation of dispatch rules are crucial to the production cycle and cost control of the wafer foundry. In the related art, in order to reduce the load of the measurement machine during mass production, it is necessary to sample each lot of products within a credible risk range.

There are many specific implementation algorithms for sampling and measurement. Some perform sampling based on the characteristic mantissa of the product number for measurement, some perform sampling based on time period for measurement, some perform sampling based on the number of pieces of passed products for measurement, and some perform sampling based on the characteristic process in the product manufacturing process for measurement.

However, the sampling measurement method in the related art is not perfect. For example, there is a risk that the machine chamber of the process station will not be measured for a long time.

SUMMARY

The sampling measurement method includes: acquiring a preset measurement ratio of each process element in a process station; acquiring an actual measurement ratio of a process element associated with a lot of products to be measured that arrive at the measurement station in the process station; and controlling a measurement machine at the measurement station to measure the lot of products to be measured when the actual measurement ratio of the associated process element is less than the corresponding preset measurement ratio.

This disclosure further provides a sampling measurement system.

The sampling measurement system includes: a first acquisition module configured to acquire a preset measurement ratio of each process element in a process station; a second acquisition module configured to acquire an actual measurement ratio of a process element associated with a lot of products to be measured that arrive at the measurement station in the process station; and a control module configured to control the measurement machine at the measurement station to measure the lot of products to be measured when the actual measurement ratio of the associated process element is less than the corresponding preset measurement ratio.

This disclosure further provides a computer device.

The computer device includes a memory storing a computer program and a processor. The processor implements the steps of the above method when the computer program is executed by the processor.

This disclosure further provides a storage medium.

The computer-readable storage medium having a computer program stored thereon. The computer program implements the steps of the above method when the computer program is executed by a processor.

BRIEF DESCRIPTION OF THE DRAWINGS

In order to illustrate the embodiments of this specification more clearly, the following will briefly introduce the drawings that need to be used in the description of the embodiments or the related art. Obviously, the drawings in the following description are merely some of the embodiments described in this specification, and other drawings can be obtained for those skilled in the art based on these drawings without any creative labor.

DETAILED DESCRIPTION

Figure 1:
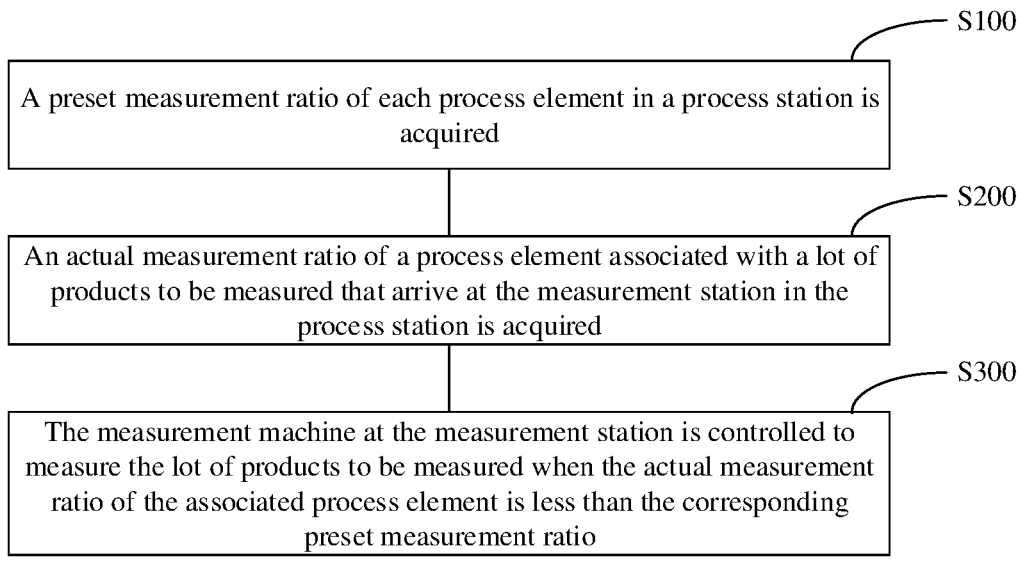
FIG. 1 is a flowchart of steps of a method according to an embodiment of this disclosure.

In order to facilitate the understanding of this disclosure, the following will make a more comprehensive description of this disclosure with reference to the relevant drawings. Some embodiments of this disclosure are shown in the drawings. However, this disclosure can be implemented in many different forms and is not limited to the embodiments described herein. On the contrary, these embodiments are provided for more thorough and comprehensive understanding of the disclosure of this disclosure.

Unless otherwise defined, all technical and scientific terms used herein have the same meaning as commonly understood by those skilled in the art of this disclosure. The terms used in the specification of this disclosure herein are only for the description of specific embodiments, and is not intended to limit this disclosure. The term "and/or" as used herein includes any and all combinations of one or more related listed items.

By studying the sampling measurement methods in the related art, the inventor(s) of the disclosure finds out that the traditional sampling measurement method of setting the measurement ratio for the measurement station is not perfect. For example, when the lot of products to be measured arrives at the measurement station, the information on the process chamber (or other process elements of the process station) associated with the lot of products to be measured is not considered when it is determined whether the lot of products to be measured is left for measurement, and thus it may lead to a situation in which the lot of products in a certain process or a certain procedure has a high measurement ratio while the lot of products in another process or procedure has an extremely low measurement ratio or even remain unmeasured for a long time, such that those skilled in the art cannot grasp the process status of the corresponding process chamber in time, and problem can hardly be found even if they occur, which is therefore disadvantageous to the stability and improvement of wafer yield.

Based on the above research, this disclosure may provide an improved sampling measurement method, including: acquiring a preset measurement ratio of each process element in a process station; acquiring an actual measurement ratio of a process element associated with the lot of products to be measured that arrive at the measurement station in the process station; when the actual measurement ratio of the associated process element is less than the corresponding preset measurement ratio, controlling a measurement machine at the measurement station to measure the lot of products to be measured. The sampling measurement method of this disclosure can implement effective improvement with respect to the insufficient measurement or missing measurement of process element of the process station during the wafer sampling measurement process.

In order to make the above objectives, features, and advantages of this disclosure more obvious and understandable, the specific embodiments of this disclosure will be described in detail below with reference to the drawings. It should be noted that these drawings are provided to help understand the embodiments of this disclosure, and should not be construed as an improper limitation to this disclosure.

Referring to FIG. 1, the sampling measurement method includes the following steps.

In S100, a preset measurement ratio of each process element at the process station is acquired.

In the wafer manufacturing process, it is necessary to grasp the process status of each process element at the process station in time so as to stabilize and improve the production yield of wafers. The above step can make each process element at the process station have a corresponding preset measurement ratio according to the actual situation, and then the preset measurement ratio can be used as the judgment standard to control the measurement action of the lot of products to be measured in the measurement station. Among them, the process element at the process station may include a process machine, a process chamber, a process type, etc.

In S200, an actual measurement ratio of a process element associated with a lot of products to be measured that arrive at the measurement station in the process station is acquired.

Each of the lots of products to be measured that arrive at the measurement station has an associated process element of the process station. By acquiring the actual measurement ratio of the associated process element, it helps compare the actual measurement ratio with the preset measurement ratio of the associated process element, and then control the measurement action of the measurement machine at the measurement station according to the comparison result.

In S300, the measurement machine at the measurement station is controlled to measure the lot of products to be measured when the actual measurement ratio of the associated process element is less than the corresponding preset measurement ratio.

If the comparison result is that the actual measurement ratio of the associated process element is less than the corresponding preset measurement ratio, the measurement machine at the measurement station will be controlled to measure the lot of products to be measured, so that the actual measurement ratio of the associated process element gets close to the preset measurement ratio thereof, and furthermore, after the sampling measurement is completed, the measurement ratio of each process element at the process station can be close to the preset measurement ratio thereof, which facilitates those skilled in the art to grasp the process status of each process element at the process station in time.

The above sampling measurement method enables each process element at the process station to independently have a preset measurement ratio, and independently calculate the actual measurement ratio of each process element according to the measurement situation of the lot of products, so as to control the measurement machine at the measurement station to measure the lot of products to be measured when the actual measurement ratio of the associated process element is less than the corresponding preset measurement ratio, thereby implementing effective improvement with respect to the insufficient measurement or missing measurement of the process element of the process station during the wafer sampling measurement process.

Figure 2:
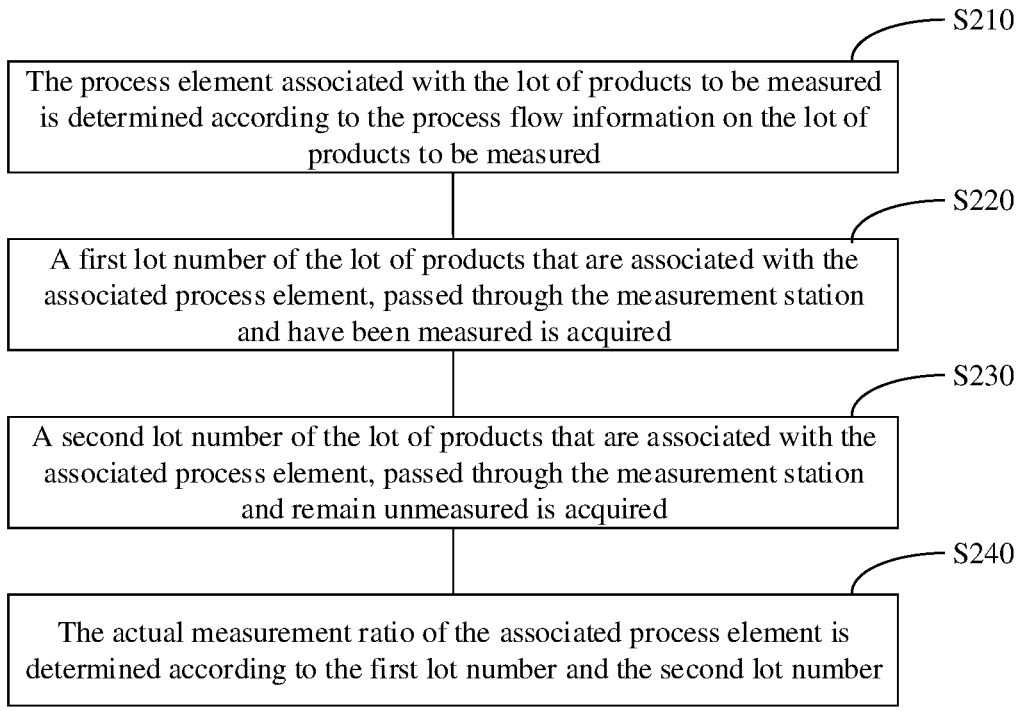
FIG. 2 is a flowchart of steps for acquiring the actual measurement ratio of the associated process element of the method according to an embodiment of this disclosure.

In an embodiment, referring to FIG. 2, step S200 may include the following steps.

In S210, the process element associated with the lot of products to be measured is determined according to the process flow information on the lot of products to be measured The process flow information includes the parameter information on each process that the wafer needs to pass through in the manufacturing process, through which the process element associated with the batch of products to be measured can be quickly determined.

In S220, a first lot number of the lot of products that are associated with the associated process elements, passed through the measurement station and have been measured is acquired.

In S230, a second lot number of the lot of products that are associated with the associated process element, passed through the measurement station and remain unmeasured is acquired.

By recording the measurement conditions of each lot of products passed through the measurement station, the number (the first lot number) of the lot of products that are associated with the process element associated with the lot of products to be measured currently arriving at the measurement station, passed through the measurement station and have been measured is acquired, and furthermore, the number (the second lot number) of the lot of products that are associated with the process element associated with the lot of products to be measured currently arriving at the measurement station, passed through the measurement station and have not been measured is acquired.

In S240, the actual measurement ratio of the associated process element is determined according to the first lot number and the second lot number.

Specifically, the actual measurement ratio of the associated process element may be calculated by the following relational formula: CR=M/(M+N); where CR represents the actual measurement ratio of the associated process element, M represents the first lot number, and N represents the second lot number.

For example, if the process element associated with the lot of products to be measured a9 currently arriving at the measurement station is process element A, and the preset measurement ratio of the process element A of the process station is 30%; in addition, among the previous recorded lots, there are two lots, a1 and a6, (that is, the first lot number is 2) which are associated with the process element A, passed through the measurement station and have been measured; while there are six lots, a2, a3, a4, a5, a7, and a8, (that is, the second lot number is 6) which are associated with the process element A, passed through the measurement station and remain unmeasured, the obtained actual measurement ratio of the process element A is 2/8=25%; and furthermore, it can be seen that if the actual measurement ratio of the process element A is less than the preset measurement ratio thereof, the measurement machine at the measurement station may be controlled to measure the lot of products to be measured a9.

Figure 3:
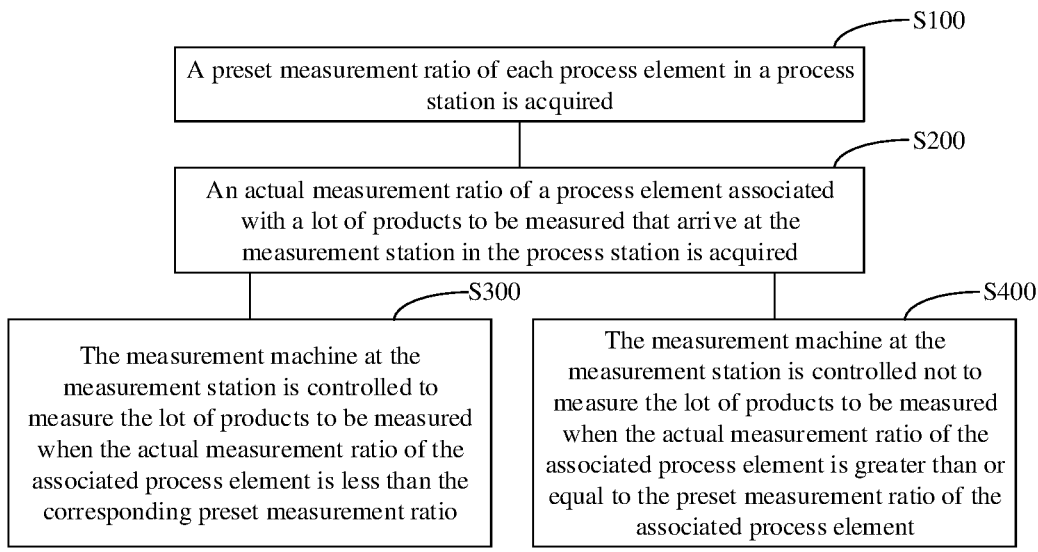
FIG. 3 is a flowchart of steps of a method according to another embodiment of this disclosure.

In an embodiment, referring to FIG. 3, the sampling measurement method may further include the following step.

In S400, the measurement machine at the measurement station is controlled not to measure the lot of products to be measured when the actual measurement ratio of the associated process element is greater than or equal to the preset measurement ratio of the associated process element.

By the above method, when the actual measurement ratio of the associated process element is greater than or equal to the preset measurement ratio of the associated process element, the actual measurement ratio of the associated process element is reduced to get close to the preset measurement ratio thereof, and at the same time, unnecessary measurement can be effectively reduced, and the use efficiency of the measurement machine at the measurement station can be improved.

Figure 4:
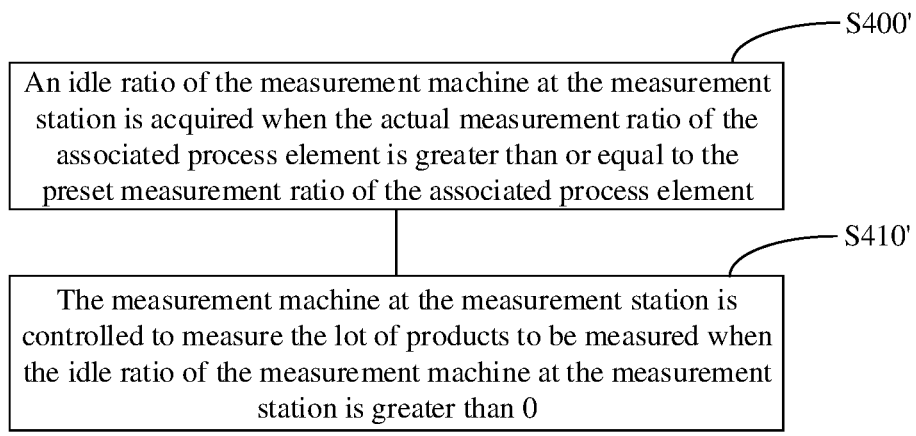
FIG. 4 is a flowchart of steps of a method according to yet another embodiment of this disclosure.

In an embodiment, referring to FIG. 4, the sampling measurement method may further include the following steps.

In S400', the idle ratio of the measurement machine at the measurement station is acquired when the actual measurement ratio of the associated process element is greater than or equal to the preset measurement ratio of the associated process element.

Specifically, whether there is a load on the measurement machine at the measuring station can be quickly learned by means of the image acquisition module or the photoelectric sensing module, and then the idle ratio of the measurement machine at the measurement station can be obtained.

In S410', the measurement machine at the measurement station is controlled to measure the lot of products to be measured when the idle ratio of the measurement machine at the measurement station is greater than 0.

If the idle ratio of the measurement machine at the measuring station is greater than 0, then even if the actual measurement ratio of the current lot of products to be measured is greater than the preset measurement ratio thereof, the lot of products to be measured can still be measured, which not only can reduce the idle ratio of the measurement machine and improve the use efficiency of the measurement machine, but also can grasp more information on the process status of the associated process element and improve the accuracy of the judgment by those skilled in the art on the process status of the associated process element.

Figure 5:
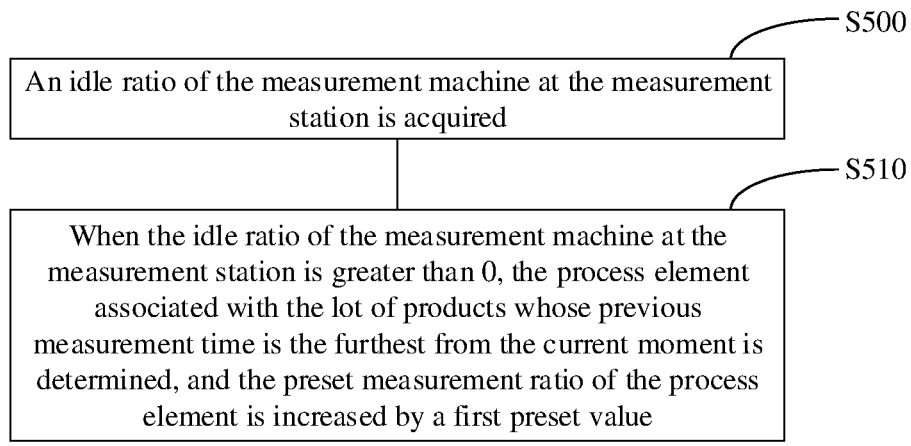
FIG. 5 is a flowchart of steps of a method according to yet another embodiment of this disclosure.

In an embodiment, referring to FIG. 5, the sampling measurement method may further include the following steps.

In S500, an idle ratio of the measurement machine at the measurement station is acquired.

In S510, when the idle ratio of the measurement machine at the measurement station is greater than 0, the process element associated with the lot of products whose previous measurement time is the furthest from the current moment is determined, and the preset measurement ratio of the process element is increased by a first preset value.

The load condition of the measurement machine can be monitored in real time by means of the image acquisition module or photoelectric sensing module, and then the idle ratio of the measurement machine at the measurement station can be acquired. If there is no load on part of the measurement machines, it means that the idle ratio of the measurement machine at the measurement station is greater than 0, the process element associated with the lot of products whose previous measurement time is the furthest from the current moment can be determined, and the preset measurement ratio of the process element is increased by the first preset value to increase the actual measurement ratio of the associated process element under the condition of making full use of the idle measurement machine, thereby improving the use efficiency of the measurement machine and ensuring that the lot of products associated with each process element can be fully measured at the same time.

For example, if the idle ratio of the measurement machine at the measurement station is greater than 0, the process element associated with the lot of products whose previous measurement time is the furthest from the current moment is the process element A and the preset measurement radio of the process element A is 25%, the preset measurement ratio of process element A is increased by 5% so as to improve the use efficiency of the measurement machine and ensure that the lot of products associated with the process element A can be fully measured at the same time.

Figure 6:
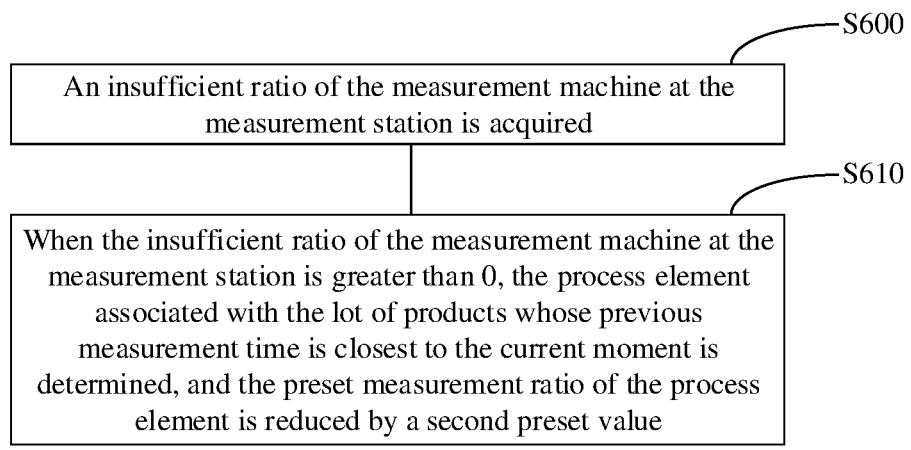
FIG. 6 is a flowchart of steps of a method according to yet another embodiment of this disclosure.

In an embodiment, referring to FIG. 6, the sampling measurement method may further include the following steps.

In S600, an insufficient ratio of the measurement machine at the measurement station is acquired.

In S610, when the insufficient ratio of the measurement machine at the measurement station is greater than 0, the process element associated with the lot of products whose previous measurement time is the closest to the current moment is determined, and the preset measurement ratio of the process element is reduced by a second preset value.

The load condition of the measurement machine can be monitored in real time by means of the image acquisition module or photoelectric sensing module, and then the insufficient ratio of the measurement machine at the measurement station can be acquired. If a queue of the lot of products to be measured exists at the measurement station, it means that the insufficient ratio of the measurement machine at the measurement station is greater than 0, and the process element associated with the lot of products whose previous measurement time is closest to the current moment can be determined, and the preset measurement ratio of the process element is reduced by the second preset value so as to appropriately reduce the actual measurement ratio of the associated process element, thereby alleviating the use load of the measurement machine and ensuring that the lot of products associated with each process element can be fully measured.

For example, if the insufficient ratio of the measurement machine at the measurement station is greater than 0, the process element associated with the lot of products whose previous measurement time is the nearest to the current moment is the process element B and the preset measurement radio of the process element B is 30%, the preset measurement ratio of process element A is reduced by 5% so as to alleviate the use load of the measurement machine and ensure that the lot of products associated with other process elements can be fully measured.

Based on the aforementioned description of the embodiments of the above sampling measurement method, this disclosure further provides a sampling measurement system. The system may include apparatuses, such as software (application), modules, components, servers and clients which use the methods described in the embodiments of this specification, and may be combined with necessary implementation hardware. Based on the same innovative concept, the system in one or more embodiments provided by the embodiments of this disclosure is as described in the following embodiments. The specific implementation of the system in the embodiments of this specification can refer to the implementation of the above method, and the repetition will not be elaborated. As used below, the term "unit" or "module" refers to a combination of software and/or hardware that can implement predetermined functions. Although the apparatus system described in the following embodiments may be implemented by means of software, the implementation by mean of hardware or a combination of software and hardware is also possible and conceived.

Figure 7:
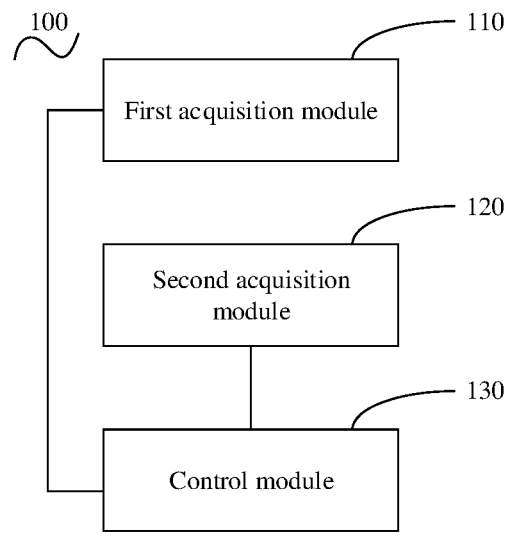
FIG. 7 is a schematic diagram of the connection of a system according to an embodiment of this disclosure.

Specifically, referring to FIG. 7, the sampling measurement system 100 includes: a first acquisition module 110 configured to acquire a preset measurement ratio of each process element in a process station; a second acquisition module 120 configured to acquire an actual measurement ratio of a process element associated with a lot of products to be measured that arrive at a measurement station at the process station; and a control module 130 which is connected to the first acquisition module 110 and the second acquisition module 120, and is configured to control a measurement machine at the measurement station to measure the lot of products to be measured when the actual measurement ratio of the associated process element is less than the corresponding preset measurement ratio. Among them, the process element at the process station includes a process machine, a process chamber, a process type, etc.

The above sampling measurement system 100 enables each process element at the process station to independently have a preset measurement ratio by the first acquisition module 110, and when certain conditions are met, the measurement machine at the measurement station is controlled by the control module 130 to measure the lot of products to be measured so as to make the actual measurement ratio of the process element associated with the lot of products to be measured that arrive at the measurement station in the process station closer to the corresponding preset measurement ratio, thereby implementing effective improvement with respect to the insufficient or missing measurement of process element of the process station in the wafer sampling and measurement process.

Figure 8:
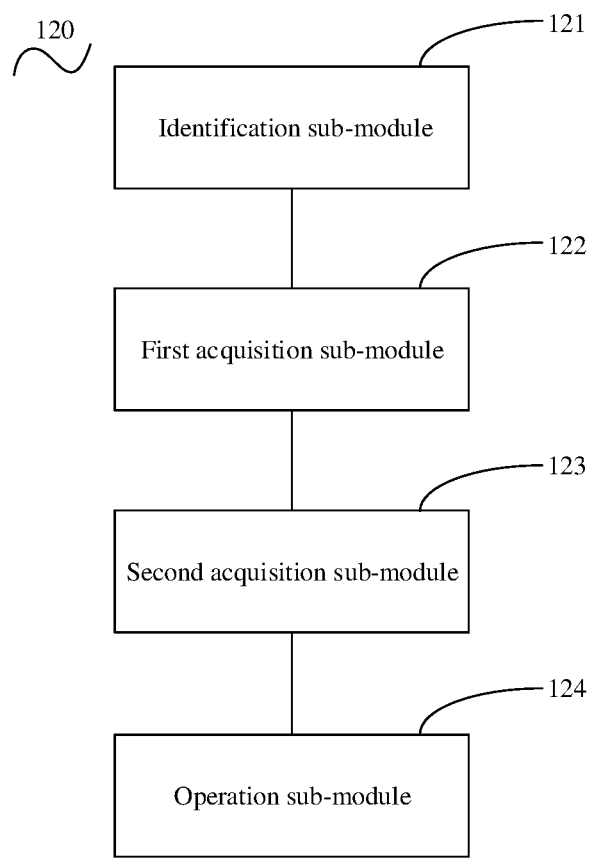
FIG. 8 is a schematic diagram of the connection of a second acquisition module of the system according to an embodiment of this disclosure.

In one embodiment, referring to FIG. 8, the second acquisition module 120 includes: an identification sub-module 121 which is configured to determine the process element associated with the lot of products to be measured according to the process flow information on the lot of products to be measured; a first acquisition sub-module 122 which is connected to the identification sub-module 121, and is configured to acquire a first lot number of the lot of products that are associated with the associated process element, passed through the measurement station and have been measured; a second acquisition sub-module 123 which is connected to the identification sub-module, and is configured to acquire the second lot number of the lot of products that are associated with the associated process element, passed through the measurement station and remain unmeasured; and an operation sub-module 124 which is connected to the first acquisition sub-module 122 and the second acquisition sub-module 123, and configured to determine the actual measurement ratio of the associated process element according to the first lot number and the second lot number. Specifically, the actual measurement ratio of the associated process element satisfies the following relational formula: $CR=M/(M+N)$; where CR represents the actual measurement ratio of the associated process element, M represents the first lot number, and N represents the second lot number.

In an embodiment, the control module may be further configured to control the measurement machine at the measurement station not to measure the lot of products to be measured when the actual measurement ratio of the associated process element is greater than or equal to the preset measurement ratio of the associated process element. By the above method, the actual measurement ratio of the associated process element can be reduced to get close to the preset measurement ratio thereof, and at the same time, unnecessary measurement can be effectively reduced, and the use efficiency of the measurement machine at the measurement station can be improved.

Figure 9:
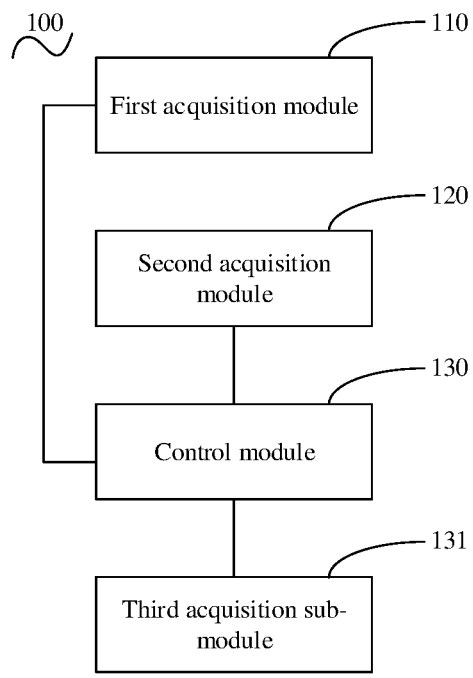
FIG. 9 is a schematic diagram of system connection of a system according to another embodiment of this disclosure.

In an embodiment, referring to FIG. 9, the system may further include: a third acquisition sub-module 131 which is connected to the control module 130, and is configured to acquire an idle ratio of the measurement machine at the measurement station when the actual measurement ratio of the associated process element is greater than or equal to the preset measurement ratio of the associated process element. The control module 130 which is further configured to control the measurement machine at the measurement station to measure the lot of products to be measured when the idle ratio of the measurement machine at the measurement station is greater than 0. This way can not only reduce the idle ratio of the measurement machine and improve the use efficiency of the measurement machine, but also grasp more information on the process status of the associated process element so as to improve the accuracy of the judgment by those skilled in the art on the process status of the associated process element.

Figure 10:
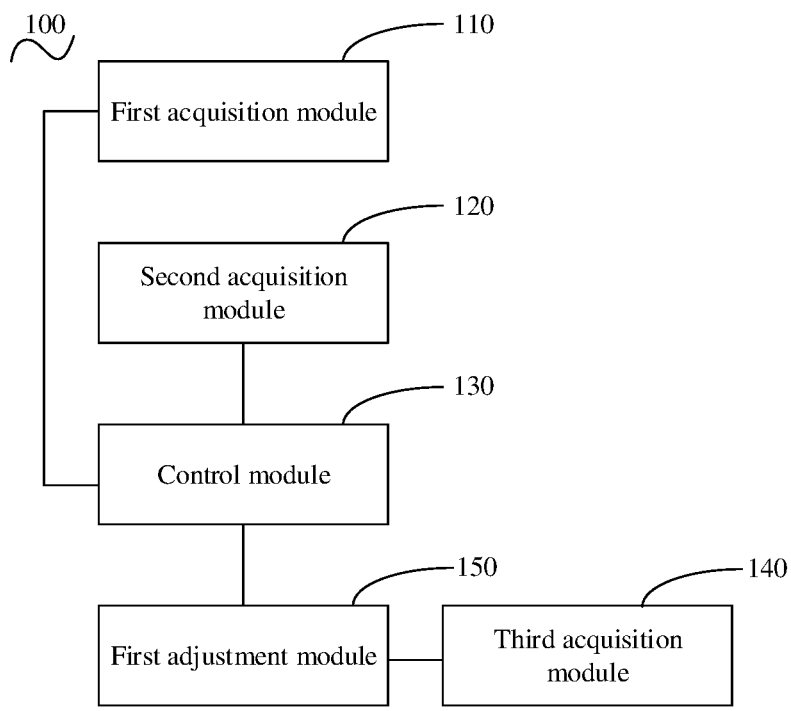
FIG. 10 is a schematic diagram of system connection of a system according to yet another embodiment of this disclosure.

In an embodiment, referring to FIG. 10, the system may further include: a third acquisition module 140 which is configured to acquire an idle ratio of the measurement machine at the measurement station; and a first adjustment module 150 which is connected to the third acquisition module 140 and the control module 130, and is configured to, when the idle ratio of the measurement machine at the measurement station is greater than 0, determine the process element associated with the lot of products whose previous measurement time is the furthest from the current moment, and increase the preset measurement ratio of the process element by a first preset value. This is conducive to improving the actual measurement ratio of the associated process element under the condition of making full use of the idle measurement machine, thereby improving the use efficiency of the measurement machine and ensuring that the lot of products associated with each process element can be fully measured at the same time.

Figure 11:
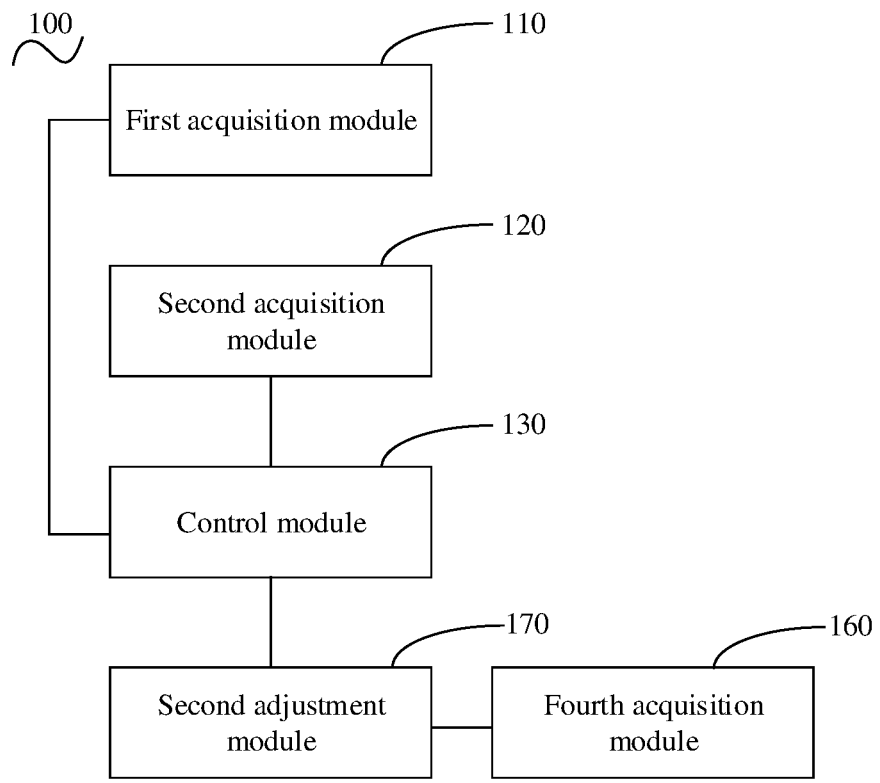
FIG. 11 is a schematic diagram of system connection of a system according to yet another embodiment of this disclosure.

In an embodiment, referring to FIG. 11, the system may further include: a fourth acquisition module 160 which is configured to acquire an insufficient ratio of the measurement machine at the measurement station; and a second adjustment module 170 which is connected to the fourth acquisition module and the control module 130, and is configured to, when the insufficient ratio of the measurement machine at the measurement station is greater than 0, determine the process element associated with the lot of products whose previous measurement time is closest to the current moment, and reduce the preset measurement ratio of the process element by a second preset value. This is conducive to appropriately reducing the actual measurement ratio of the associated process element, thereby alleviating the use load of the measurement machine and ensuring that the lot of products associated with each process element can be fully measured.

The following will demonstrate the effects of this disclosure by the specific application of the method of this disclosure.

Figure 12A:
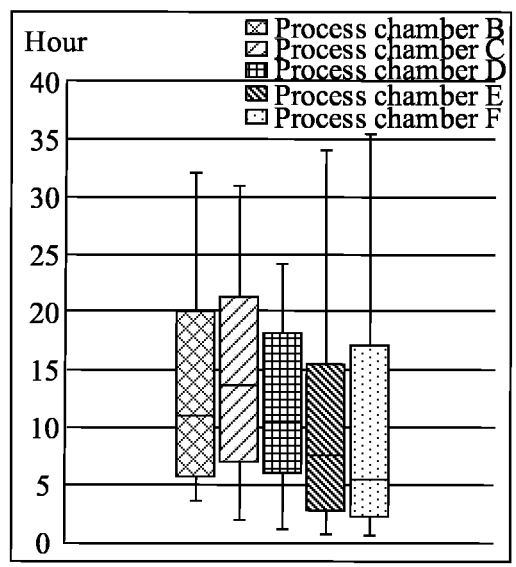
FIG. 12A to FIG. 12C provide schematic diagrams of the application effect of a system according to an embodiment of this disclosure.
Figure 12B:
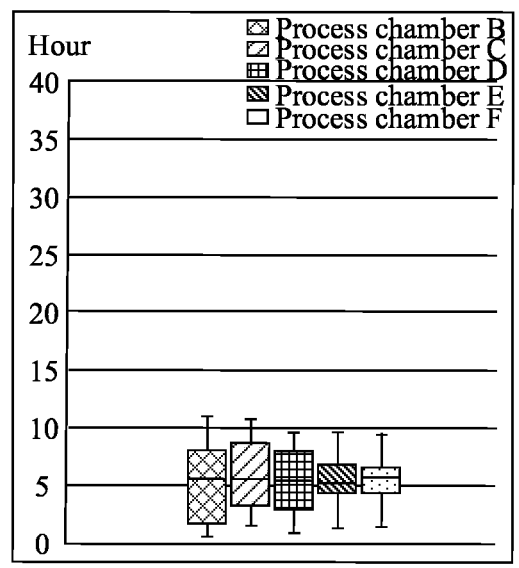
Figure 12C:
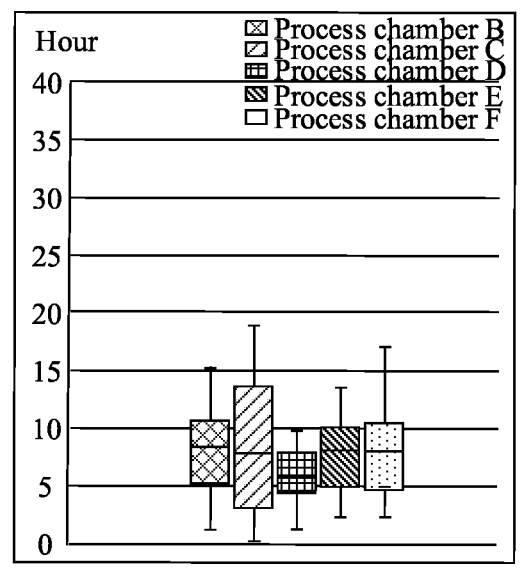

Referring to FIG. 12A to FIG. 12C, the process station has a process chamber B, a process chamber C, a process chamber D, a process chamber E, and a process chamber F, each of which represents a process element. FIG. 12A shows the sampling measurement time interval of each process chamber without applying the sampling measurement method of this disclosure, from which it can be seen that the sampling measurement time interval of each process chamber is mainly concentrated within 15 hours (the rectangle length of each graph in the figure) and the maximum sampling measurement time interval will not exceed 30 hours on average (the difference between the upper and lower limits of each graph in the figure); FIG. 12B shows the sampling measurement time interval of each process chamber after applying the sampling measurement method of this disclosure, where the preset measurement ratio of each process chamber is set to 25%, from which it can be seen that the sampling measurement time interval of each process chamber is mainly concentrated within 6 hours and the maximum sampling measurement time interval will not exceed 10 hours on average, from the above, it can be acknowledged that the method of this disclosure can greatly shorten the measurement time interval of the process chamber; FIG. 12C shows the sampling measurement time interval of each process chamber when the sampling measurement method of this disclosure is applied and the preset measurement ratio of each process chamber is reduced to 18%, from which it can be seen that although the sampling measurement time interval of some chambers has increased compared to the sampling measurement time interval when the preset measurement ratio is set to 25%, the overall sampling measurement time interval is still shorter than the sampling measurement time interval of each process chamber shown in FIG. (a). By changing the preset measurement ratio, the sampling measurement time interval of the lot of products corresponding to each process chamber can be controlled more accurately, and the risk of the lot of products corresponding to the process chamber not being measured for a long time can be avoided.

This disclosure further provides a computer device that includes a memory storing a computer program and a processor. The processor implements the steps of the above-mentioned method when the computer program is executed by the processor.

The above computer device may be configured to execute the aforementioned sampling measurement method, so as to realize the automatic sampling and measurement of wafers at the measurement station, and implement improvement with respect to the insufficient or missing measurement of process element of the process station in the wafer sampling and measurement process.

This disclosure further provides a storage medium on which a computer program is stored. When the computer program is executed by a processor, the steps of the above-mentioned method will be realized.

The above storage medium stores the execution program of the aforementioned sampling measurement method, which can be adapted to various computer devices, thereby implementing improvement with respect to the insufficient or missing measurement of the process element of the process station during the wafer sampling and measurement process.

The various technical features of the above-mentioned embodiments can be combined arbitrarily. In order to make the description concise, all possible combinations of the various technical features in the above embodiments are not described. However, as long as there is no contradiction in the combination of these various technical features, all should be considered as the scope of this specification.

The above-mentioned embodiments only express several implementation modes of this disclosure, and although their descriptions are relatively specific and detailed, they should not be understood as limiting the scope of this disclosure. It should be noted that those skilled in the art can make various modifications and improvements to this disclosure without departing from the concept of this disclosure, all of which fall within the scope of protection of this disclosure. Therefore, the scope of protection by this patent disclosure shall be subject to the appended claims.

What is claimed is:

1. A sampling measurement method, comprising:
   acquiring a preset measurement ratio of each process element in a process station;
   acquiring an actual measurement ratio of a process element associated with a lot of products to be measured that arrive at a measurement station in the process station;
   in a case where the actual measurement ratio of the process element associated with the lot of products to be measured is less than a corresponding preset measurement ratio, controlling a measurement machine at the measurement station to measure the lot of products to be measured;

acquiring an idle ratio of the measurement machine at the measurement station; and in a case where the idle ratio of the measurement machine at the measurement station is greater than 0, determining a process element associated with the lot of products whose previous measurement time is furthest from a current moment, and increasing the preset measurement ratio of the process element associated with the lot of products whose previous measurement time is furthest from the current moment by a first preset value.

2. The sampling measurement method according to claim 1, wherein acquiring the actual measurement ratio of the process element associated with the lot of products to be measured that arrive at the measurement station in the process station comprises:

determining the process element associated with the lot of products to be measured according to process flow information on the lot of products to be measured;

acquiring a first lot number of the lot of products that are associated with the process element associated with the lot of products to be measured, passed through the measurement station and have been measured;

acquiring a second lot number of the lot of products that are associated with the process element associated with the lot of products to be measured, passed through the measurement station and remain unmeasured; and determining the actual measurement ratio of the process element associated with the lot of products to be measured according to the first lot number and the second lot number.

3. The sampling measurement method according to claim 2, wherein the actual measurement ratio of the process element associated with the lot of products to be measured satisfies a following relational formula:

$$CR=M/(M+N);$$

wherein CR represents the actual measurement ratio of the process element associated with the lot of products to be measured, M represents the first lot number, and N represents the second lot number.

4. The sampling measurement method according to claim 1, further comprising:

in a case where the actual measurement ratio of the process element associated with the lot of products to be measured is greater than or equal to the corresponding preset measurement ratio, controlling the measurement machine at the measurement station not to measure the lot of products to be measured.

5. The sampling measurement method according to claim 1, further comprising:

in a case where the actual measurement ratio of the process element associated with the lot of products to be measured is greater than or equal to the corresponding preset measurement ratio, acquiring the idle ratio of the measurement machine at the measurement station; and in a case where the idle ratio of the measurement machine at the measurement station is greater than 0, controlling the measurement machine at the measurement station to measure the lot of products to be measured.

6. The sampling measurement method according to claim 1, further comprising:

acquiring an insufficient ratio of the measurement machine at the measurement station; and in a case where the insufficient ratio of the measurement machine at the measurement station is greater than 0, determining the process element associated with the lot of products whose previous measurement time is closest to the current moment, and reducing the preset measurement ratio of the process element associated with the lot of products whose previous measurement time is closest to the current moment by a second preset value.

7. The sampling measurement method according to claim 1, wherein the each process element in the process station comprise a process machine, a process chamber, or a process type.

8. A computer device, comprising:

a memory storing a computer program; and a processor configured to execute the computer program stored in the memory, wherein when executing the computer program, the processor is configured to:

acquire a preset measurement ratio of each process element in a process station;

acquire an actual measurement ratio of a process element associated with a lot of products to be measured that arrive at a measurement station in the process station;

in a case where the actual measurement ratio of the process element associated with the lot of products to be measured is less than a corresponding preset measurement ratio, control a measurement machine at the measurement station to measure the lot of products to be measured;

acquire an idle ratio of the measurement machine at the measurement station; and in a case where the idle ratio of the measurement machine at the measurement station is greater than 0, determine a process element associated with the lot of products whose previous measurement time is furthest from a current moment, and increase the preset measurement ratio of the process element associated with the lot of products whose previous measurement time is furthest from the current moment by a first preset value.

9. The computer device according to claim 8, wherein when acquiring the actual measurement ratio of the process element associated with the lot of products to be measured that arrive at the measurement station in the process station, the processor is configured to:

determine the process element associated with the lot of products to be measured according to process flow information on the lot of products to be measured;

acquire a first lot number of the lot of products that are associated with the process element associated with the lot of products to be measured, passed through the measurement station and have been measured;

acquire a second lot number of the lot of products that are associated with the process element associated with the lot of products to be measured, passed through the measurement station and remain unmeasured; and determine the actual measurement ratio of the process element associated with the lot of products to be measured according to the first lot number and the second lot number.

10. The computer device according to claim 9, wherein the actual measurement ratio of the process element associated with the lot of products to be measured satisfies a following relational formula:

$$CR=M/(M+N);$$

wherein CR represents the actual measurement ratio of the process element associated with the lot of products to be measured, M represents the first lot number, and N represents the second lot number.

11. The computer device according to claim 8, wherein the processor is further configured to:
   in a case where the actual measurement ratio of the process element associated with the lot of products to be measured is greater than or equal to the corresponding preset measurement ratio, control the measurement machine at the measurement station not to measure the lot of products to be measured.

12. The computer device according to claim 8, wherein the processor is further configured to:
   in a case where the actual measurement ratio of the process element associated with the lot of products to be measured is greater than or equal to the corresponding preset measurement ratio, acquire the idle ratio of the measurement machine at the measurement station; and
   in a case where the idle ratio of the measurement machine at the measurement station is greater than 0, control the measurement machine at the measurement station to measure the lot of products to be measured.

13. The computer device according to claim 8, wherein the processor is further configured to:
   acquire an insufficient ratio of the measurement machine at the measurement station; and
   in a case where the insufficient ratio of the measurement machine at the measurement station is greater than 0, determine the process element associated with the lot of products whose previous measurement time is closest to the current moment, and reduce the preset measurement ratio of the process element associated with the lot of products whose previous measurement time is closest to the current moment by a second preset value.

14. The computer device according to claim 8, wherein the each process element in the process station comprise a process machine, a process chamber, or a process type.

15. A non-transitory computer-readable storage medium having a computer program stored thereon, wherein when the computer program is executed by a processor, the computer program causes the processor to:
   acquire a preset measurement ratio of each process element in a process station;
   acquire an actual measurement ratio of a process element associated with a lot of products to be measured that arrive at a measurement station in the process station;
   in a case where the actual measurement ratio associated with the lot of products to be measured is less than a corresponding preset measurement ratio, control a measurement machine at the measurement station to measure the lot of products to be measured;
   acquire an idle ratio of the measurement machine at the measurement station; and
   in a case where the idle ratio of the measurement machine at the measurement station is greater than 0, determine a process element associated with the lot of products whose previous measurement time is furthest from a current moment, and increase the preset measurement ratio of the process element associated with the lot of products whose previous measurement time is furthest from the current moment by a first preset value.

* * * * *